United States Patent
Choi et al.

(10) Patent No.: US 7,705,810 B2
(45) Date of Patent: Apr. 27, 2010

(54) FOUR-COLOR DATA PROCESSING SYSTEM

(75) Inventors: Beohm-Rock Choi, Seoul (KR); Ung-Gyu Min, Namyangju-si (KR); Joon-Hoo Choi, Seoul (KR); Jin-Koo Jung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 1105 days.

(21) Appl. No.: 10/804,722

(22) Filed: Mar. 19, 2004

(65) Prior Publication Data

US 2004/0222999 A1    Nov. 11, 2004

(30) Foreign Application Priority Data

May 7, 2003    (KR) ............... 10-2003-0029153

(51) Int. Cl.
*G09G 3/30*    (2006.01)
(52) U.S. Cl. .................. 345/77; 345/76; 315/169.3
(58) Field of Classification Search ............ 345/76–84, 345/690, 694–695, 87–89; 313/483–512; 315/169.1–169.3
See application file for complete search history.

(56) References Cited

U.S. PATENT DOCUMENTS

| | | | | |
|---|---|---|---|---|
| 5,929,843 A | * | 7/1999 | Tanioka ................... | 345/600 |
| 6,317,157 B1 | | 11/2001 | Takayama ................ | 348/441 |
| 6,475,845 B2 | * | 11/2002 | Kimura .................... | 438/200 |
| 6,724,934 B1 | * | 4/2004 | Lee et al. ................. | 382/167 |
| 6,750,874 B1 | * | 6/2004 | Kim ......................... | 345/600 |

(Continued)

FOREIGN PATENT DOCUMENTS

CN    1217622    5/1999

(Continued)

OTHER PUBLICATIONS

European Search Report; Application No. 04252242.5-2205; Date: Mar. 20, 2006.

(Continued)

*Primary Examiner*—Alexander Eisen
*Assistant Examiner*—Jason M Mandeville
(74) *Attorney, Agent, or Firm*—Cantor Colburn LLP

(57)    ABSTRACT

An organic electro-luminescent display (OELD) device for processing multi-color gray-scale data, comprises a four-color converting part for converting primary RGB gray-scale data into compensated RGBW gray-scale data by adding white gray-scale data to the primary RGB gray-scale data, a data driving part for processing the compensated RGBW gray-scale data provided from the four-color converting part to generate four-color signals in an analog type, a scan driving part for generating scan signals in sequence, and an OELD panel for emitting light with a color in response to the four-color signals from the data driving part and the scan signals from the scan driving part. The four-color converting part includes a gamma converting part for converting the primary RGB gray-scale data, a white extracting part for extracting a white color component from the gamma-converted RGB data, a data determining part for generating four-color RGBW data by subtracting the white color component from the gamma-converted RGB data and adding the white gray-scale data to the gamma-converted RGB data, and a reverse-gamma converting part for reverse-gamma converting the four-color RGBW data.

14 Claims, 12 Drawing Sheets

U.S. PATENT DOCUMENTS

| | | | |
|---|---|---|---|
| 6,897,876 B2 * | 5/2005 | Murdoch et al. | 345/589 |
| 6,919,681 B2 * | 7/2005 | Cok et al. | 313/500 |
| 6,954,191 B1 * | 10/2005 | Hirano et al. | 345/77 |
| 7,012,588 B2 * | 3/2006 | Siwinski | 345/83 |
| 7,151,517 B2 * | 12/2006 | Lee | 345/88 |
| 7,277,075 B1 * | 10/2007 | Hirano et al. | 345/89 |
| 7,486,417 B2 * | 2/2009 | Baek | 358/1.9 |
| 2001/0050532 A1 * | 12/2001 | Eida et al. | 313/504 |
| 2002/0122160 A1 * | 9/2002 | Kunzman | 353/31 |
| 2003/0151694 A1 * | 8/2003 | Lee et al. | 348/687 |
| 2004/0046725 A1 * | 3/2004 | Lee | 345/88 |
| 2004/0113875 A1 * | 6/2004 | Miller et al. | 345/82 |
| 2004/0195963 A1 * | 10/2004 | Choi et al. | 313/504 |

FOREIGN PATENT DOCUMENTS

| | | |
|---|---|---|
| JP | 2000-200061 | 7/2000 |
| JP | 2001-119714 | 4/2001 |
| JP | 2001-290439 | 10/2001 |
| KR | 10-2002-0082153 | 10/2002 |
| KR | 10-2003-0013700 | 2/2003 |
| KR | 10-2003-0017240 | 3/2003 |
| KR | 10-2003-0021741 | 3/2003 |
| WO | WO 01/37249 A2 | 5/2001 |

OTHER PUBLICATIONS

All the references cited in the Search Report are listed above.
European Office Action; Oct. 23, 2007; 04252242.5. All references cited in the foreign Office action have been previously submitted in an Information Disclosure Statement.

* cited by examiner

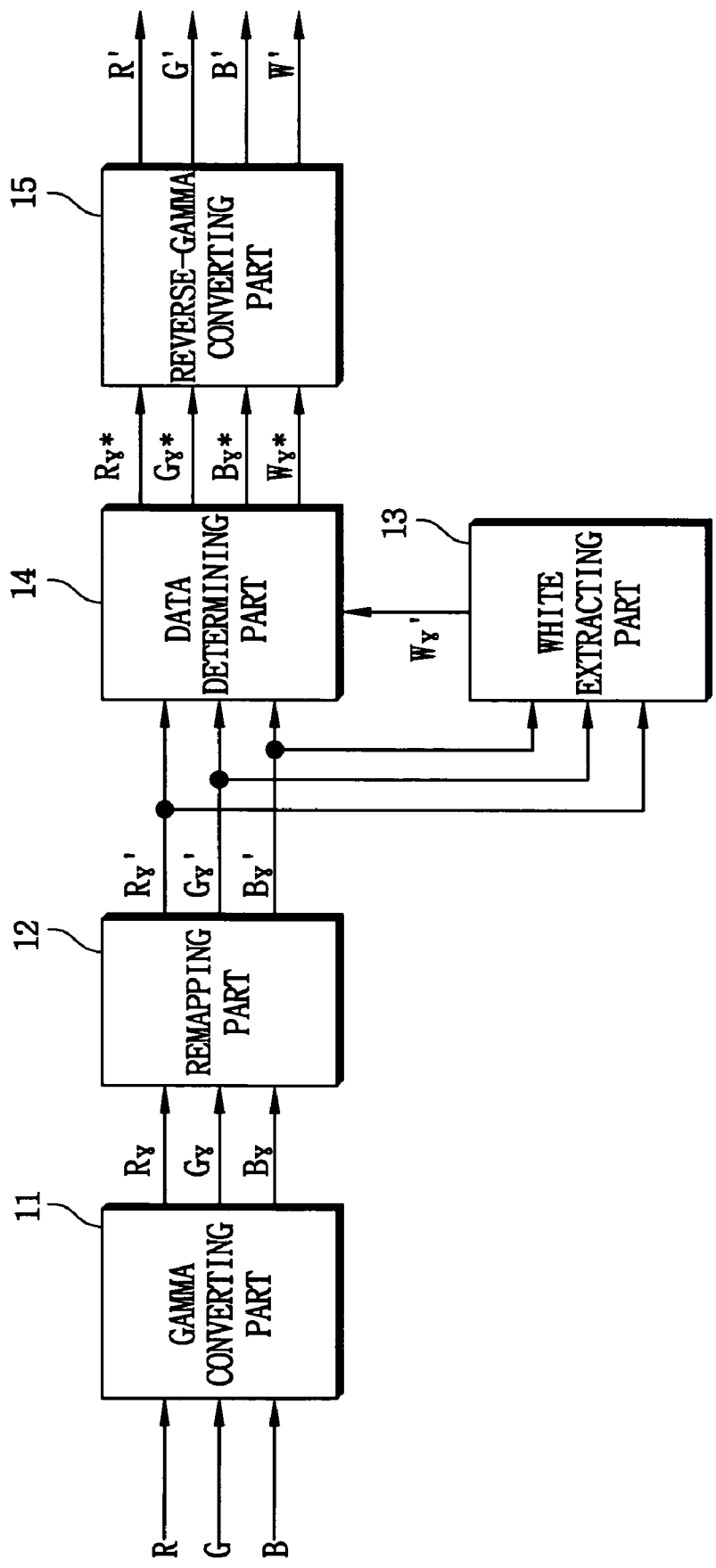

FOUR-COLOR DATA PROCESSING SYSTEM

BACKGROUND OF THE INVENTION

1. Field of the Invention

The present invention relates to a system for processing 4-color data, and more particularly to an organic electroluminescent display (OELD) device and a method for processing 4-color gray-scale data to improve luminance and color sensitivity of displayed colors.

2. Description of the Related Art

In general, liquid crystal display (LCD) devices improve luminance by employing 4-color pixels each having white color (W) in addition to red color (R), green color (G) and blue color (B). Such LCD devices improve the luminance of white color or an achromatic color obtained from a mixture of colors. However, in case of colors having high color purity such as primary colors, luminance of those colors is decreased and color sensitivity is also deteriorated when employing the method of mixing colors.

FIG. 1 is a graph for describing a conventional 4-color display. Referring to FIG. 1, displayable colors in RG system are within the rectangle area defined by points 0, R, RG and G. In the RG system, two-color (i.e., red and green) data is processed and colors are displayed by two-color pixels each having red and green. An RGY system may be defined by means of the RG system. The RGY system has a red pixel, a green pixel and a yellow pixel that is an optical mix of the red pixel and the green pixel. The optical mix increases the luminance of the RG system.

Assuming that the maximum luminance of the optical mix of the red and green pixels is substantially the same as the maximum luminance of the yellow pixel, the maximum luminance of an optical mix of the red, green and yellow pixels is two times brighter than the maximum luminance of the optical mix of the red and green pixels. Therefore, an optical mix of color pixels increases luminance.

However, when a primary color is displayed, it is difficult or unable to increase luminance of the primary color pixel. For example, when primary red color is displayed by a red pixel, luminance of the red pixel is not increased without a yellow pixel. Therefore, displayable colors in RGY system are within the hexagonal area defined by points 0, R, R'G, R'G', RG' and G.

As a result, a color of a first original gray-scale data (I) may be displayed by using a first compensated gray-scale data (I') that are extended twice, but a color of a second original gray-scale data (II) may be displayed by using a second compensated gray-scale data (II') that are extended less than twice. This is because while the first original gray-scale data (I) is within the rectangle area defined by points 0, R'G, R'G' and RG', the second original gray-scale data (II) is out of the rectangle area.

Luminance of a mixed color existing within the rectangle area defined by points 0, R1, RG and G1 may be increased twice. However, luminance of a mixed color existing within the triangular area defined by points 0, R and R1 or the triangular area defined by points 0, G and G1 may not be increased twice. Also, since the size of a pixel in the RGY system decreases compared with that in RG system, luminance of RGY system decreases as well.

For the same reasons for the RG and RGY systems, luminance in RGB or RGBW system also decreases. Especially, there is no or little advantage of improving luminance in case of displaying primary colors, and luminance may be decreased because of a decrease in the pixel size.

Therefore, a need exists for a multiple color data processing system which improves optical efficiency while preventing decrease or deterioration of luminance and color sensitivity.

SUMMARY OF THE INVENTION

The above discussed and other drawbacks and deficiencies of the prior art are overcome or alleviated by the 4-color data processing system of the present invention. In one embodiment, a 4-color data processing device comprises a gamma converting part for performing gamma conversion with respect to RGB gray-scale data to obtain gamma-converted RGB data, a white extracting part for extracting a white color component from the gamma-converted RGB data provided from the gamma converting part, a data determining part for receiving the gamma-converted RGB data from the gamma converting part and the white color component from the white extracting part and generating four-color RGBW data, and a reverse-gamma converting part for performing reverse-gamma conversion with respect to the four-color RGBW data provided from the data determining part to generate reverse-gamma converted RGBW data to be displayed.

The white extracting part may generate minimum gray-scale data of the respective gamma-converted RGB data as the white color component. Alternatively, the white extracting part may include a first comparison unit for determining which color data of the gamma-converted RGB data has a minimum value, and a second comparison unit for comparing the minimum value determined by the first comparison unit with a predetermined value. In this case, the white extracting part generates the minimum value of the gamma-converted RGB data as the white color component if the minimum value is smaller than the predetermined value, and generates the predetermined value as the white color component if the minimum value is equal to or larger than the predetermined value. The predetermined value may be defined by $aG_{max}^{y}$, where "$G_{max}$" denotes a maximum gray-scale level of the RGB gray-scale data, and "a" is a ratio of each color data of the gamma-converted RGB data to a gray-scale number of a corresponding color data of the RGB gray-scale data.

In another embodiment, a 4-color data processing device comprises a gamma converting part for performing gamma conversion with respect to RGB gray-scale data to obtain gamma-converted RGB data, a remapping part for multiplying the gamma-converted RGB data by a scaling factor and remapping the multiplication results to generate remapped RGB data, a white extracting part for extracting a white color component from the remapped RGB data provided from the remapping part, a data determining part for receiving the remapped RGB data from the remapping part and the white color component from the white extracting part and generating four-color RGBW data, and a reverse-gamma converting part for performing reverse-gamma conversion with respect to the four-color RGBW data provided from the data determining part to generate reverse-gamma converted RGBW data to be displayed.

In still another embodiment, an organic electro-luminescent display (OELD) device for processing multi-color gray-scale data, comprises a four-color converting part for converting primary RGB gray-scale data into compensated RGBW gray-scale data by adding white gray-scale data to the primary RGB gray-scale data, a data driving part for processing the compensated RGBW gray-scale data provided from the four-color converting part to generate four-color signals in an analog type, a scan driving part for generating scan signals in sequence, and an OELD panel for emitting light with a color in response to the four-color signals from the data driving part and the scan signals from the scan driving part. The OELD panel may include pixels each having a switching element having a conduction path for transferring corresponding one of the four-color signals from the data driving part in response to corresponding one of the scan signals from the scan driving part, a driving element having a conduction path for transferring a voltage signal provided from a power supply line in response to the corresponding one of the four-color signals provided from the switching element, and a organic electro-luminescent element for generating light in response to the voltage signal provided from the driving element.

As an exemplary embodiment, the OELD panel may include a first insulating layer formed on a substrate, a current control transistor formed on the first insulating layer for providing a controlled current, a second insulating layer formed on the current control transistor having contact holes in which source and drain electrodes of the current control transistor are formed, a third insulating layer formed on the second insulating layer and the source and drain electrodes of the current control transistor, a pixel electrode formed on the third insulating layer, in which a part of the pixel electrode is extended to be in contact with the drain electrode of the current control transistor through a contact hole formed in the third insulating layer, partition walls formed on the third insulating layer and the pixel electrode, adjacent ones of the partition walls defining a luminescent region of the OELD panel, an organic electro-luminescent layer formed on partition walls and the pixel electrode, for emitting red, green, blue and white color light, and an electrode layer formed on the organic electro-luminescent layer to serve as a cathode of the OELD device. The electrode layer is a metal layer so that light is reflected by the metal layer and emitted through the substrate, or it is transparent so that light passes through the electrode layer.

As another exemplary embodiment, the OELD panel may include a first insulating layer formed on a substrate, a current control transistor formed on the first insulating layer for providing a controlled current, a second insulating layer formed on the current control transistor having contact holes in which source and drain electrodes of the current control transistor are formed, a color pixel layer formed on the second insulating layer and the source and drain electrodes, the color pixel layer including red, green, blue and white color filters, a planarizing layer formed on the color pixel layer, a pixel electrode formed on the planarizing layer, a part of the pixel electrode being extended to be in contact with the drain electrode of the current control transistor through contact holes formed in the planarizing layer and the color pixel layer, partition walls formed on the planarizing layer and the pixel electrode, adjacent ones of the partition walls defining a luminescent region of the OELD panel, an organic electro-luminescent layer formed on partition walls and the pixel electrode, and a metal electrode layer formed on the organic electro-luminescent layer to serve as a cathode of the OELD device.

In another embodiment, the OELD panel may include a first insulating layer formed on a substrate, a current control transistor formed on the first insulating layer for providing a controlled current, a second insulating layer formed on the current control transistor having contact holes in which source and drain electrodes of the current control transistor are formed, a third insulating layer formed on the second insulating layer and the source and drain electrodes of the current control transistor, a pixel electrode formed on the third insulating layer, in which a part of the pixel electrode being extended to be in contact with the drain electrode of the current control transistor through a contact hole formed in the third insulating layer, partition walls formed on the third insulating layer and the pixel electrode, adjacent ones of the partition walls defining a luminescent region of the OELD panel, an organic electro-luminescent layer formed on partition walls and the pixel electrode, a transparent electrode layer formed on the organic electro-luminescent layer to serve as a cathode of the OELD device, and a color pixel layer formed on the transparent electrode layer, the color pixel layer including red, green, blue and white color filters.

In further another embodiment, a method for processing multi-color data may comprise performing a gamma conversion with respect to primary RGB gray-scale data to generate gamma-converted RGB data, extracting a white color component from the gamma-converted RGB data, determining four-color RGBW data using the white color component and the gamma-converted RGB data, and performing a reverse-gamma conversion with respect to the four-color RGBW data to generate compensated four-color RGBW data.

In still another embodiment, a method for processing multi-color data may comprise performing a gamma conversion with respect to primary RGB gray-scale data to generate gamma-converted RGB data, multiplying the gamma-converted RGB data with a scaling factor and remapping the multiplication results to generate remapped RGB data, extracting a white color component from the remapped RGB data, determining four-color RGBW data using the white color component and the remapped RGB data, and performing a reverse-gamma conversion with respect to the four-color RGBW data to generate compensated four-color RGBW data.

These and other objects, features and advantages of the present invention will become apparent from the following detailed description of the exemplary embodiments thereof, which is to be read in conjunction with the accompanying drawings, wherein like elements are designated by identical reference numbers throughout the several views.

BRIEF DESCRIPTION OF THE DRAWINGS

This disclosure will present in detail the following description of exemplary embodiments with reference to the following figures wherein:

FIG. 4 is a schematic diagram illustrating the 4-color converting part in FIG. 3 according to an embodiment of the present invention;

DETAILED DESCRIPTION OF THE INVENTION

Detailed illustrative embodiments of the present invention are disclosed herein. However, specific structural and functional details disclosed herein are merely representative for purposes of describing exemplary embodiments of the present invention. The exemplary embodiments are described below with reference to the accompanying drawings in which the same numerals are used to indicate the same or equivalent parts.

Generally, once the luminance of a backlight and the type of a color filter are determined in a liquid crystal display (LCD) device, R•G•B colors of the LCD device each have luminance with a predetermined magnitude so that it is difficult or unable to increase the luminance. In contrast, in organic electro-luminescent display (OELD) devices, R•G•B colors each have luminance of which magnitude may be increased by controlling a data voltage for each of the R•G•B colors.

In LCD devices, optical efficiency (i.e., light transmittance) of an LCD device increases in case that luminance of the LCD device is increased. In contrast, optical efficiency has no such relationship with luminance in OELD devices. In other words, when a larger current flows in a pixel electrode by controlling a data voltage in an OELD device, luminance of the OELD device increases but its optical efficiency does not increase. In order to reduce power consumption of an OELD, its optical efficiency should be increased. The OELD device according to the present invention has improved optical efficiency as well as luminance, and a detailed description thereof follows below.

An OELD, in particular, active matrix OELD (AMOELD), includes an organic luminescent stack having a plurality of organic thin films. The organic thin films are disposed between a first electrode (e.g., anode) that is made of transparent material such as indium tin oxide (ITO) and a second electrode (e.g., cathode) that is made of metal having a low work function. When a direct current is applied to the first electrode and the second electrode, holes from the first electrode and electrons from the second electrode are injected into an organic luminescent layer and combined therein. As a result, light is generated from the OELD device.

Figure 1:
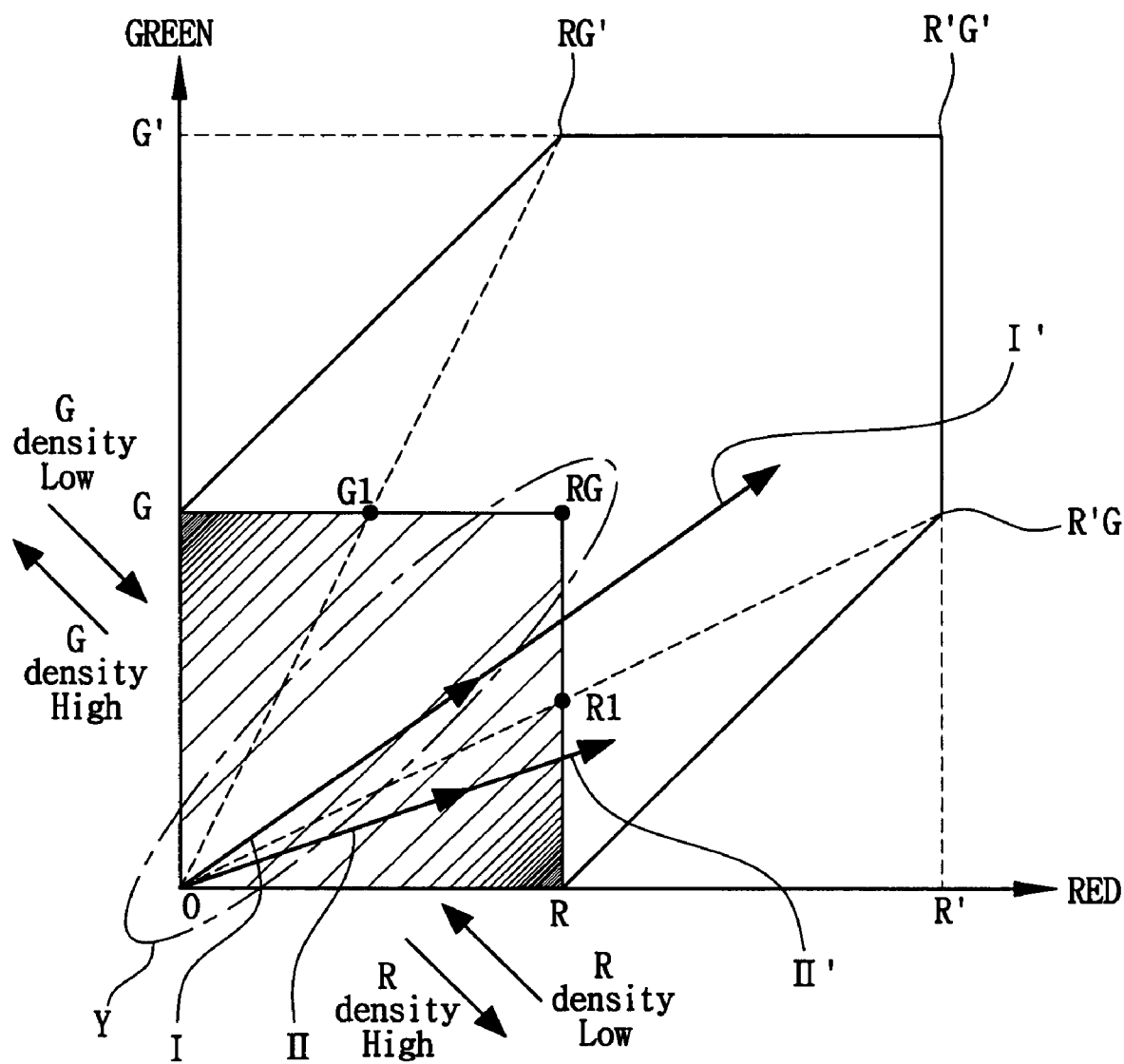
FIG. 1 is a graph for describing a conventional 4-color display.
Figure 2:
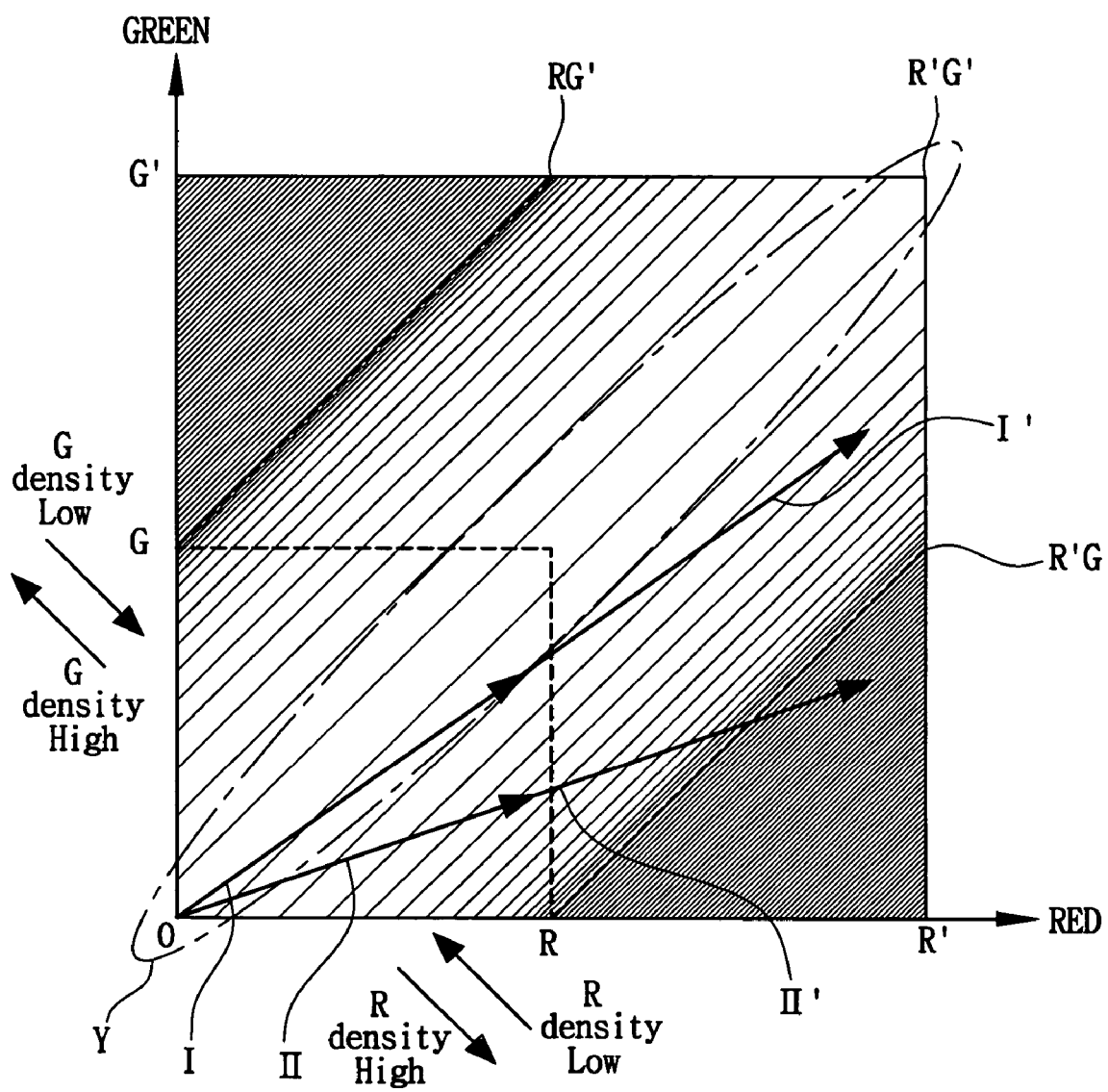
FIG. 2 is a graph for describing a 4-color display according to the present invention.

FIG. 2 is a graph for describing a color display by means of an OELD device according to an exemplary embodiment of the present invention. Compared with the color display of a conventional LCD device as shown in FIG. 1 in which the luminance is scaled within the hexagonal-shaped area (0, R, R'G, R'G', RG', G), the luminance in the color display of an OELD device according to the present invention is scaled in a rectangular-shaped area (0, R, R', R'G', RG', G', G) having extended gray-scale areas (R, R', R'G and G, RG', G'). This is because a higher scaling factor S is employed in the OELD device of the present invention.

In the OELD device, gray-scale data of white color (W) is extracted from primary gray-scale data of RGB colors, and compensated RGBW gray-scale data is obtained using the extracted W gray-scale data and the primary RGB gray-scale data. Here, the primary RGB gray-scale data is externally provided, and the compensated RGBW gray-scale data is data for four colors. As a result, luminance in the OELD device improves as much as the scaling factor S times, and an optical efficiency of the OELD device improves as well.

Referring again FIG. 1, if a specific color is defined within the hexagonal-shaped area (0, R, R'G, R'G', RG', G), primary RGB gray-scale data may be converted into RGBW gray-scale data that is used to represent a gray-scale of the specific color. However, if a color is defined in a triangular-shaped area (R, R', R'G or G, G', RG'), RGBW gray-scale data converted from the primary RGB data exceeds a gray-scale range available in a conventional LCD device and 4-color display method.

In contrast, the OELD device of the present invention employs a data driving device which enables colors defined in the triangular areas as well as the hexagonal area to be displayed using RGBW gray-scale data. The data driving device has a capability of processing data with a larger size than that of the primary RGB gray-scale data. For example, when the primary RGB gray-scale data is 6-bit data, the data driving device is capable of processing 7-bit or 8-bit size data so that the RGBW gray-scale data larger than the 6-bit RGB gray-scale data may be processed by the data driving device.

Referring to FIG. 2, a first primary gray-scale data I is converted into a first compensated gray-scale data I' to display a first color, and a second primary gray-scale data II is converted into a second compensated gray-scale data II' to display a second color. Since the second color may be displayed using the second compensated gray-scale data II' that is in the extended gray-scale area, the luminance of the second color may be higher than (as high as the scaling factor S times) that of the color displayed using the second primary gray-scale data II.

When primary RGB gray-scale data is converted into compensated RGBW gray-scale data, a scaling factor is determined, for example, to be "1" or more. In this embodiment, the scaling factor is "2" (This will be described in detail below).

In the OELD device of the present invention, white gray-scale data is extracted from primary RGB gray-scale data, and the primary RGB gray-scale data is subtracted by the white gray-scale data to obtain new RGB gray-scale data. From the new RGB data and the extracted white gray-scale data, compensated RGBW gray-scale data is obtained that is data of four (4) colors, red, green, blue and white. In case that the scaling factor is "1", although there is no or little increase in the luminance by adding the white gray-scale data, optical efficiency of display is increased so as to reduce power consumption. The luminance may be increased by controlling data voltage.

Figure 3:
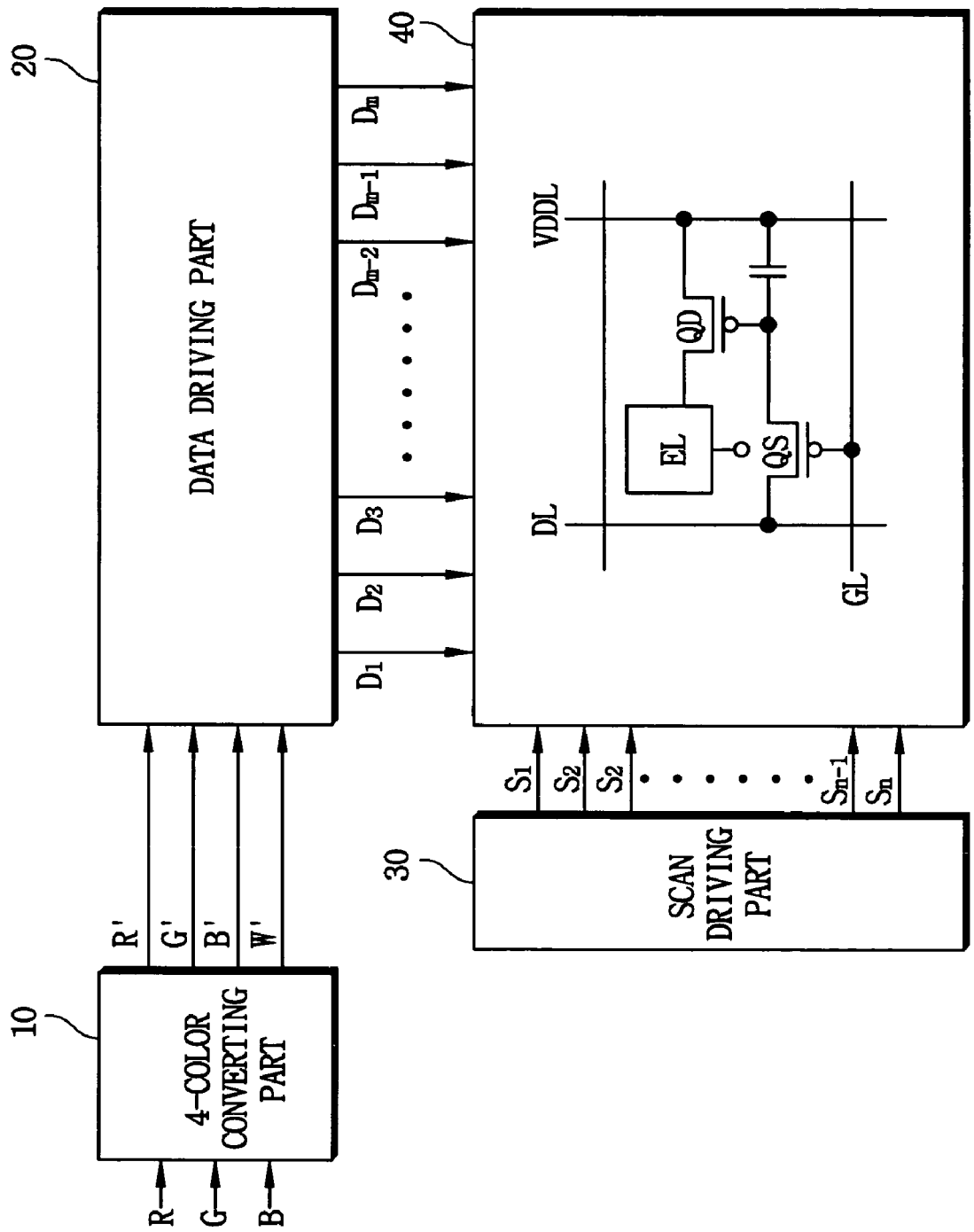
FIG. 3 is a schematic diagram illustrating an OELD device according to an exemplary embodiment of the present invention.

FIG. 3 is a schematic diagram illustrating an OELD device according to an exemplary embodiment of the present invention. The OELD device includes a 4-color converting part 10, a data driving part 20, a scan driving part 30, and an OELD panel 40.

The 4-color converting part 10 converts primary RGB gray-scale data R, G, B into compensated RGBW gray-scale data R', G', B', W' that is then provided to the data driving part 20. The primary RGB gray-scale data R, G, B is externally supplied from, for example, an exterior host or a graphic controller (not shown). The compensated RGBW gray-scale data R', G', B', W' is obtained by adding white gray-scale data to increase luminance.

The data driving part 20 processes the compensated RGBW gray-scale data R', G', B', W' from the 4-color converting part 10 to generate data signals D1, D2, ..., Dm in an analog type. The OELD penal 40 receives the data signals and display colors in accordance with the data signals. The scan driving part 30 provides the OELD panel 40 with a plurality of scan signals S1, S2, ..., Sn in sequence.

The OELD panel 40 includes a plurality of data lines DL, a plurality of scan lines GL, and a plurality of current supplying lines VDDL arranged in a matrix form. The data lines DL transmit the data signals D1, D2, ..., Dm, the scan lines GL transmit the scan signals S1, S2, ..., Sn, and the current supplying lines VDDL transmit power externally supplied.

The OELD panel 40 includes a plurality of pixels. Each of the pixels has a switching element QS, an organic electro-luminescent element EL, and a driving element QD. The switching element QS has first and second terminals connected to the data line DL and the scan line GL, respectively. The switching element QS also has a third terminal through which a data signal from the data line DL is output in response the scan signal applied to the second terminal. In other words, the conduction path of the switching element QS for transmitting a data signal is turned on or off by a scan signal applied the second terminal.

The organic electro-luminescent element EL has a first terminal connected to a polarity terminal and a second terminal receiving a current signal. The organic electro-luminescent element EL generates light of which luminance varies in response to the amount of the current signal provided to the second terminal.

The driving element QD has a first terminal connected to the second terminal of the organic electro-luminescent element EL and a second terminal connected to the current supplying line VDDL. The driving element QD also has a third terminal connected to the third terminal of the switching element. The driving element has a conduction path formed from the second terminal to the first terminal through which the current supplied from the power supply line VDDL flows to the organic electro-luminescent element EL. The conduction path of the driving element QD is controlled (i.e., turned on or off) in response to the data signal provided from the third terminal of the switching element QS. By controlling the current provided to the organic electro-luminescent element EL through the conduction path of the driving element QD, the luminance of light emitted by the organic electro-luminescent element EL is controlled.

The pixels in the OELD panel 40 each display a color, one of red, green, blue and white using corresponding one of red light, green light, blue light and a white light. The pixels may be an active light-emitting type or a color filter type. The active light-emitting type pixels each generate R light, G light, B light or W light by the EL element, and the color filter type pixels each generate R light, G light, B light or W light through R filter, G filter, B filter or W filter.

FIG. 4 is a schematic diagram illustrating the 4-color converting part in the FIG. 3 according to an exemplary embodiment of the present invention. The 4-color converting part 10 in FIG. 4 includes a gamma converting part 11, a remapping part 12, a white extracting part 13, a data determining part 14, and a reverse-gamma converting part 15. The 4-color converting part 10 receives primary RGB gray-scale data and converts it into 4-color RGBW gray-scale data.

In detail, the gamma converting part 11 receives the primary RGB gray-scale data and converts it into gamma-converted RGB data. Each color data of the primary RGB data is converted into each color data of the gamma-converted RGB data as shown below in Expression 1.

$$R_y = aR^y$$
$$G_y = aG^y$$
$$B_y = aB^y \qquad \text{Expression 1}$$

Here, $R_y$, $G_y$ and $B_y$ are normalized luminance data of R color, G color and B color, respectively, with respect to the maximum luminance of corresponding one of the colors. Also, "a" denotes $(1/G_{max})^y$, and $R^y$, $G^y$ and $B^y$ are gray-scale numbers corresponding to R color, G color and B color, respectively. $G_{max}$ denotes a maximum gray-scale level. For example, when the full gray-scale of RGB data is "64", its $G_{max}$ is "63".

The remapping part 12 receives the gamma-converted RGB data and performs multiplication and remapping with respect to each color data of the gamma-converted RGB data. For example, the remapping part 12 multiplies each color data $R_y$, $G_y$, $B_y$ of the gamma-converted RGB data by scaling factor "2" as shown below in Expression 2. The remapping part 12 then provides the remapped RGB data to the white extracting part 13 and the data determining part 14.

$$R_y' = SR^y$$
$$G_y' = SG^y$$
$$B_y' = SB^y \qquad \text{Expression 2}$$

Here, "S" denotes a scaling factor, a ratio of the maximum luminance of white obtained from composition of RGB colors to the maximum luminance of white obtained from composition of RGBW colors. The scaling factor S is preferably "2" when a color filter is used.

The white extracting part 13 receives the remapped RGB data and extracts white color component from the remapped RGB data in consideration of its respective color data $R_y'$, $G_y'$, $B_y'$. The white color component is then provided to the data determining part 14.

Figure 5A:
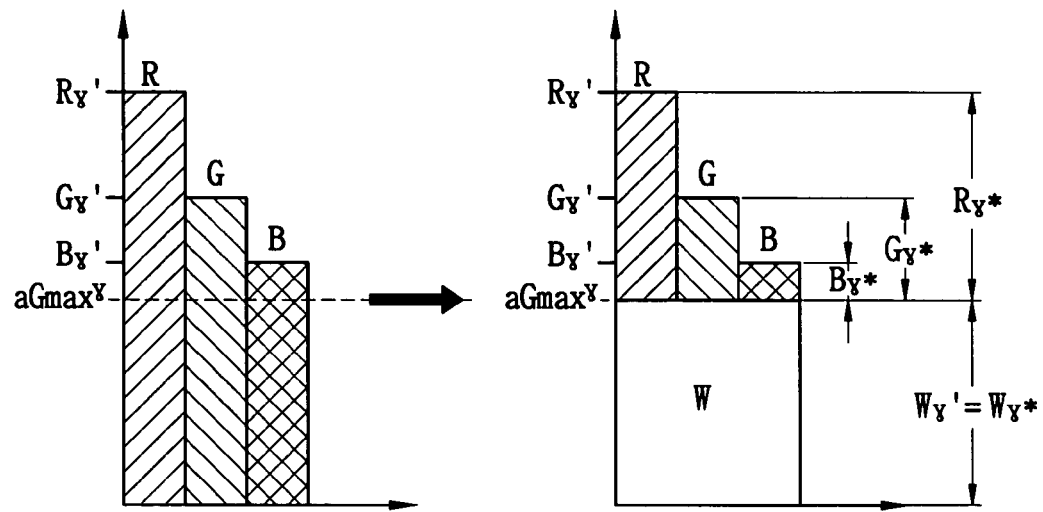
FIGS. 5A and 5B are graphs for describing extraction of a white component.

Referring to FIG. 5A, when the minimum luminance of the color data $R_y'$, $G_y'$, $B_y'$ of the remapped RGB data is equal to or larger than a predetermined value, for example, $aG_{max}^y$, the predetermined value $aG_{max}^y$ becomes the white color component $W_y'$ that is supplied to the data determining part 14. In this example, the blue color data $B_y'$ has the minimum luminance that is larger than the predetermined value $aG_{max}^y$.

Figure 5B:
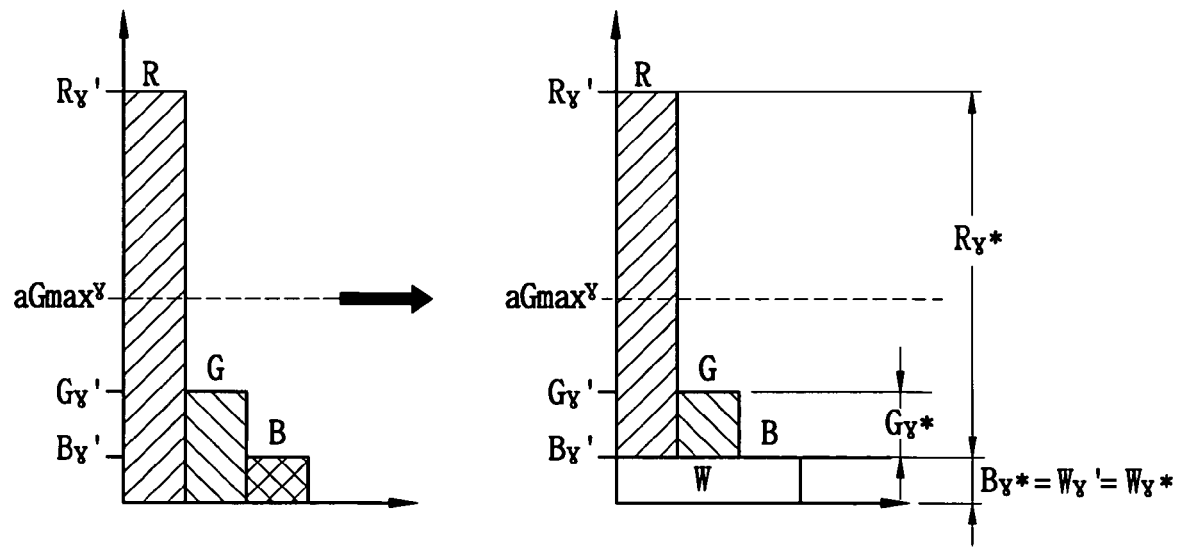

Referring to FIG. 5B, when the minimum luminance of the color data $R_{y'}$, $G_{y'}$, $B_{y'}$ of the remapped RGB data is smaller than $aG_{max}^y$, the minimum luminance of the color data $R_y'$, $G_y'$, $B_y'$ becomes the white color component $W_y'$ that is supplied to the data determining part 14. In this example, the blue color data $B_y'$ has the minimum luminance that is smaller than $aG_{max}^y$. Such while color component extraction may be expressed as in Expression 3.

$$W_y' = aG_{max}^y, \text{ if Min}[R_y', G_y', B_y'] \geq aG_{max}^y$$

$$W_y' = \text{Min}[R_y', G_y', B_y'], \text{ if Min}[R_y', G_y', B_y'] < aG_{max}^y \qquad \text{Expression 3}$$

The data determining part 14 receives the remapped RGB data from the remapping part 12 and the white color component from the white extracting part 13 and determines new RGBW data ($R_y^*$, $G_y^*$, $B_y^*$, $W_y^*$) based on the input data. Each color data of the new RGBW data is obtained by subtracting the white component from corresponding color data of the remapped RGB data as described in Expression 4 below. The new RGBW data is then provided to the reverse-gamma converting part 15.

$R_y^* = R_y' - W_y'$ $G_y^* = G_y' - W_y'$ $B_y^* = B_y' - W_y'$ $W_y^* = W_y'$      Expression 4

The reverse gamma converting part 15 performs reverse-gamma conversion with respect to the respective color data $R_y^*, G_y^*, B_y^*, W_y^*$ of the new RGBW data provided from the data determining part 14 to generate reverse-gamma converted RGBW gray-scale data $R_y^*, G_y^*, B_y^*, W_y^*$. Expression 5 below shows the reverse-gamma conversion performed in the reverse-gamma converting part 15. The compensated RGBW gray-scale data is then provided to the data driving part 20 (referring to FIG. 3).

$R' = (R_y^*/a)^{1/\gamma}$ $G' = (G_y^*/a)^{1/\gamma}$ $B' = (B_y^*/a)^{1/\gamma}$ $W' = (W_y^*/a)^{1/\gamma}$      Expression 5

In order to display a color with higher color purity such as a primary color in the extended gray-scale area in the FIG. 2 graph, color data of the 4-color converted RGBW data (R', G', B', W') may be larger than the maximum gray-scale level (Gmax) so as to exceed the maximum luminance displayable by the gray scaling. However, since the gray scaling is extended in the present invention, the color data exceeding the maximum luminance is able to be displayed by means of the data driving IC. The data driving IC in the present invention has capability of processing data of a larger bit-size data than that of the primary RGB gray-scale data. For this purpose, the data driving part 20 may implemented with multiple data driving devices.

Although the white extracting part 13 extracts the white color component by comparing the minimum luminance of the remapped RGB data with the predetermined value a $G_{max}^\gamma$ in the above-described embodiment, the minimum luminance of the respective color data of the remapped RGB data may be defined, without the comparison process, as the white color component to be extracted and provided to the data determining part 14. In other words, the white color component is extracted from the respective color data of the remapped RGB data without defining a predetermined value $aG_{max}^\gamma$. The color data other than the color data of the minimum luminance that is defined as the white color component, are defined by the difference between the respective color data other than the minimum luminance color data and the white color component.

In the embodiment of FIG. 4, the gamma converted RGB gray-scale data is multiplied by scale factor "2" so as to extend the gray-scale twice, for extracting the white color component to generate the new RGBW gray-scale data. In this case, it may be necessary to extend the bit-size of the data driving IC. For example, although a 6-bit size data driving IC may be eligible for 64 gray-scale, a 7-bit size data driving IC should be used in case that the gray-scale is extended to 70 or 80 gray-scale. To avoid increase in the bit-size of the data driving IC, the color data may be processed without the multiplication of the scaling factor. A detailed description of such embodiment follows.

Figure 6:
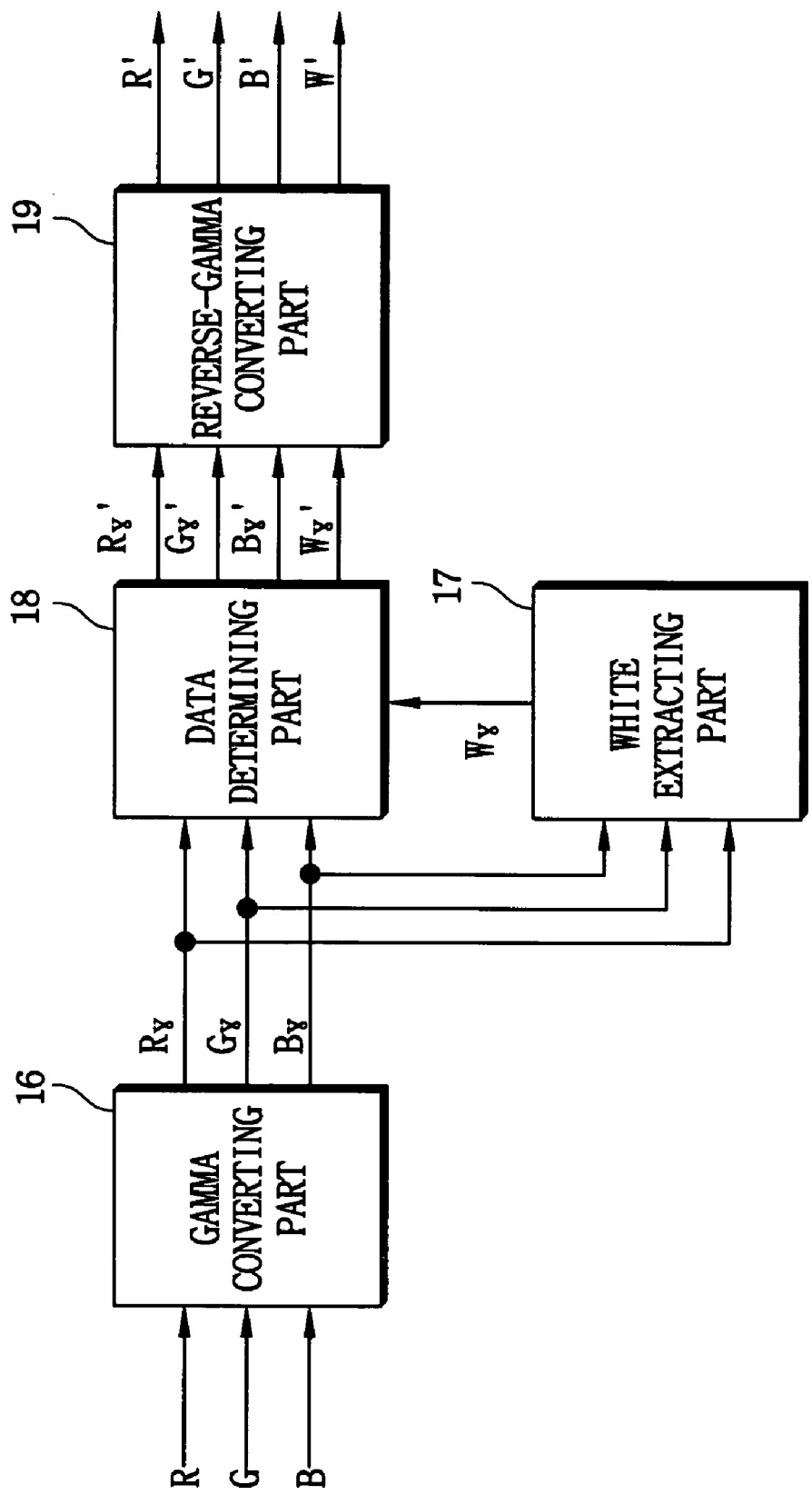
FIG. 6 is a schematic diagram illustrating the 4-color converting part in FIG. 3 according to another embodiment of the present invention.

FIG. 6 is a schematic diagram illustrating the 4-color converting part according to another embodiment of the present invention. The 4-color converting part 10' in FIG. 6 includes a gamma converting part 16, a white extracting part 17, a data determining part 18, and a reverse-gamma converting part 19. The 4-color converting part 10' converts primary RGB gray-scale data into 4-color RGBW gray-scale data.

The gamma converting part 16 receives the primary RGB data and converts each color data of the primary RGB data into each color data of the gamma-converted RGB data $R_y$, $G_y$, $B_y$ as described in Expression 6 below. The gamma-converted RGB data $R_y$, $G_y$, $B_y$ is then provided to the white extracting part 17 and the data determining part 18.

$R_y = aR^\gamma$ $G_y = aG^\gamma$ $B_y = aB^\gamma$      Expression 6

Each color data $R_y$, $G_y$, $B_y$ of the gamma-converted RGB data is normalized luminance data of corresponding color data R, G, B of the primary RGB data with respect to its maximum luminance. In the above Expression 6, "a" is equal to $(1/G_{max})^\gamma$, and "$G_{max}$" is a maximum gray-scale level. For example, when a full gray-scale is "64", $G_{max}$ is "63" and the gray-number is between "0" and "63". Also, "$R^\gamma$", "$G^\gamma$" and "$B^\gamma$" are gray-scale numbers corresponding to R, G and B colors, respectively.

Figure 7:
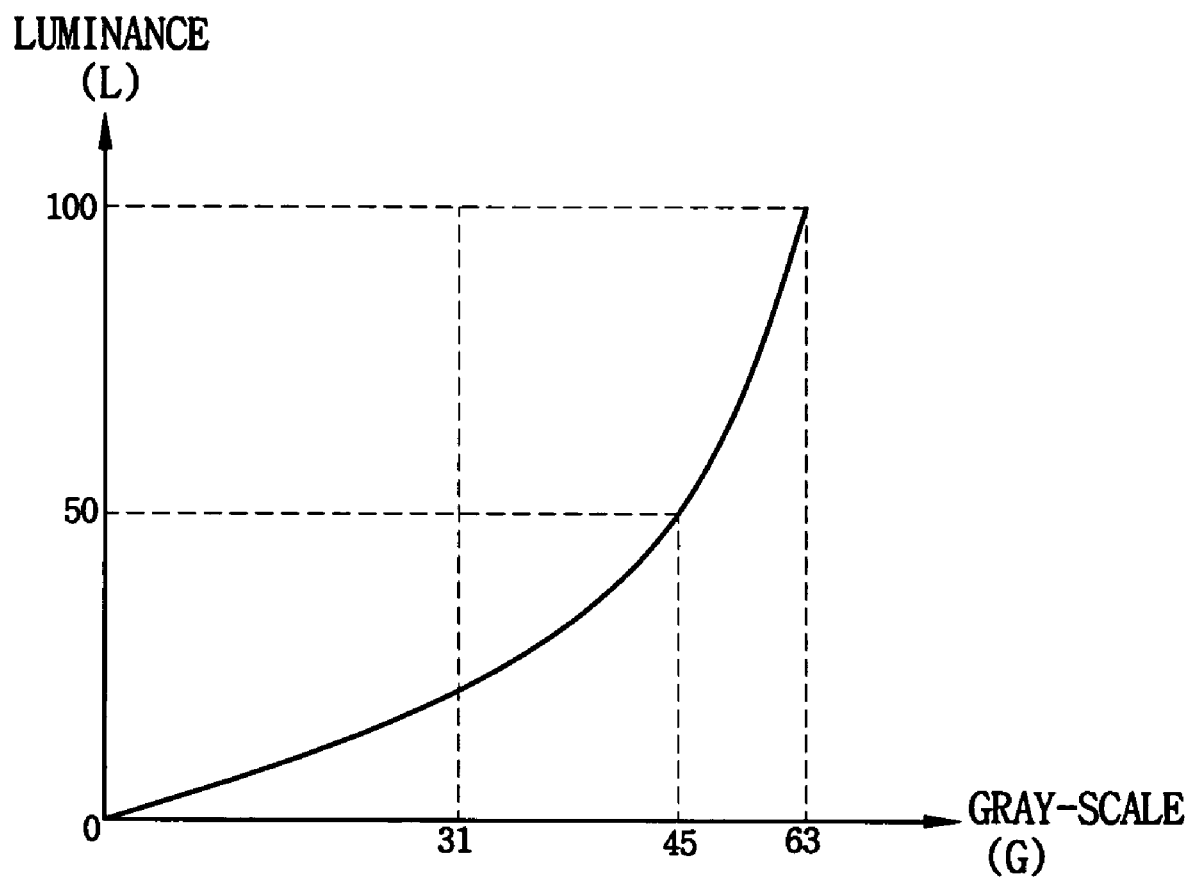
FIG. 7 is a graph showing gamma characteristics with respect to gray-scale data.

The white extracting part 17 receives the gamma-converted RGB data $R_y$, $G_y$, $B_y$ and extracts the white color component from the gamma converted RGB data. The extracted white color component is then provided to the data determining part 18. In case of 64 full gray-scale, for example, the gray-scale corresponding to a half luminance of the full gray-scale is 46 gray-scale (not 32 gray-scale) as shown in FIG. 7. In this case, the white color component may be determined as described in Expression 7 below.

$W_y = a \cdot 46^\gamma$, if $\mathrm{Min}[R_y, G_y, B_y] \geq a \cdot 46^\gamma$ $W_y = \mathrm{Min}[R_y, G_y, B_y]$, if $\mathrm{Min}[R_y, G_y, B_y] < a \cdot 46^\gamma$      Expression 7

In another example, the white color component may be determined as the minimum data of the respective color data $R_y$, $G_y$, $B_y$ of the gamma converted RGB data as described in Expression 8 below.

$W_y = \mathrm{Min}[R_y, G_y, B_y]$      Expression 8

The white color component $W^y$ is then provided to the data determining part 18 which also receives the gamma-converted RGB data from the gamma converting part 16. The data determining part 18 determines each color data $R_y''$, $G_y''$, $B_y''$, $W_y''$ of the new RGBW data based on corresponding color data of the gamma-converted RGB data and the white color component as described in Expression 9 below.

$R_y'' = R_y - W_y$ $G_y'' = G_y - W_y$ $B_y'' = B_y - W_y$ $W_y'' W_y$      Expression 9

The new RGBW data $R_y''$, $G_y''$, $B_y''$, $W_y''$ obtained by the data determining part 18 is then provided to the reverse-gamma compensation part 19. The reverse-gamma compensation part 19 converts each color data $R_y''$, $G_y''$, $B_y''$, $W_y''$ of the RGBW data to generate corresponding color data R', G', B', W' of the reverse-gamma converted RGBW gray-scale data as described in Expression 10 below.

$R' = (R_y''/a)^{1/\gamma}$ $G' = (G_y''/a)^{1/\gamma}$ $$B' = (B_y''/a)^{1/y'}$$

$$W' = (W_y''/a)^{1/y'} \quad \text{Expression 10}$$

The reverse-gamma converted RGBW data R', G', B', W' is then provided to the data driving part 20 (referring to FIG. 3).

In this embodiment, the white extracting part 17 extracts the white color component by comparing the minimum luminance of the respective color data $R_y$, $G_y$, $B_y$ of the gamma-converted RGB data with a predetermined value (e.g., a·46$^y$ in case of 64 full gray-scale) and provides the extracted white color component to the data determining part 14. However, the white color component may also be extracted by defining the minimum luminance of the respective color data $R_y$, $G_y$, $B_y$ of the gamma-converted RGB data as the white color component (referring to FIG. 5B).

Figure 8A:
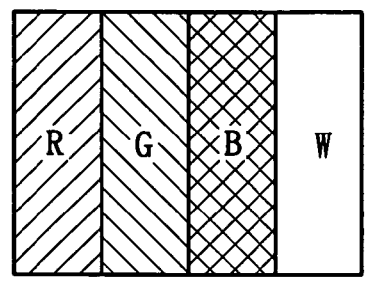
FIGS. 8A to 8C are schematic views showing arrangements of pixels of the OELD device of present invention.
Figure 8B:
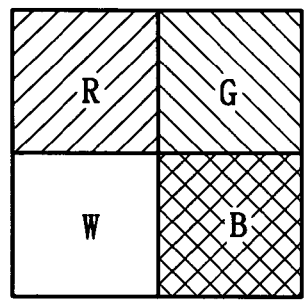
Figure 8C:
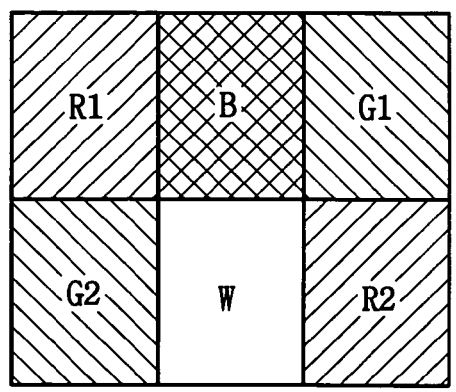

A description of arrangement of pixels in the OELD device of the present invention follows. FIGS. 8A-8C are schematic views illustrating exemplary arrangements of pixels for displaying 4 colors in the OELD device of the present invention. Referring to FIG. 8A, a pixel of the OELD device includes four (4) sub-pixels, a red sub-pixel R, a green sub-pixel G, a blue sub-pixel B, and a white sub-pixel W. The sub-pixels each have a stripe shape and are arranged in parallel to each other to constitute a pixel. Since the pixel includes the white sub-pixel, the luminance of the OELD device is increased.

Although the sizes of the sub-pixels in FIG. 8A is substantially identical, those sizes may be different from each other. In this case, switching transistors, data lines and/or gate lines may have different intervals corresponding to those of the sub-pixels having different sizes. However, the switching transistors, data lines and/or gate lines may still maintain intervals substantially same as those for the sub-pixels having a substantially identical size.

Referring to FIG. 8B, a pixel of the OELD device includes a red sub-pixel R, a green sub-pixel G, a blue sub-pixel B, and a white sub-pixel W arranged in a 2×2 lattice shape.

Referring to FIG. 8C, a pixel of the OELD device includes two red sub-pixels R1, R2, two green sub-pixels G1, G2, a blue sub-pixel B, and a white sub-pixel W arranged in a 2×3 lattice shape. As shown in FIG. 8C, the two red sub-pixels R1, R2 are disposed apart from each other and the two green sub-pixels G1, G2 are also disposed apart from each other. In another embodiment, however, the two red sub-pixels R1, R2 may be disposed to be adjacent to each other, and the two green sub-pixels G1, G2 may also be disposed in the same manner.

Various embodiments of the OELD panel of the OELD device according to the present invention are described in detail below.

Figure 9:
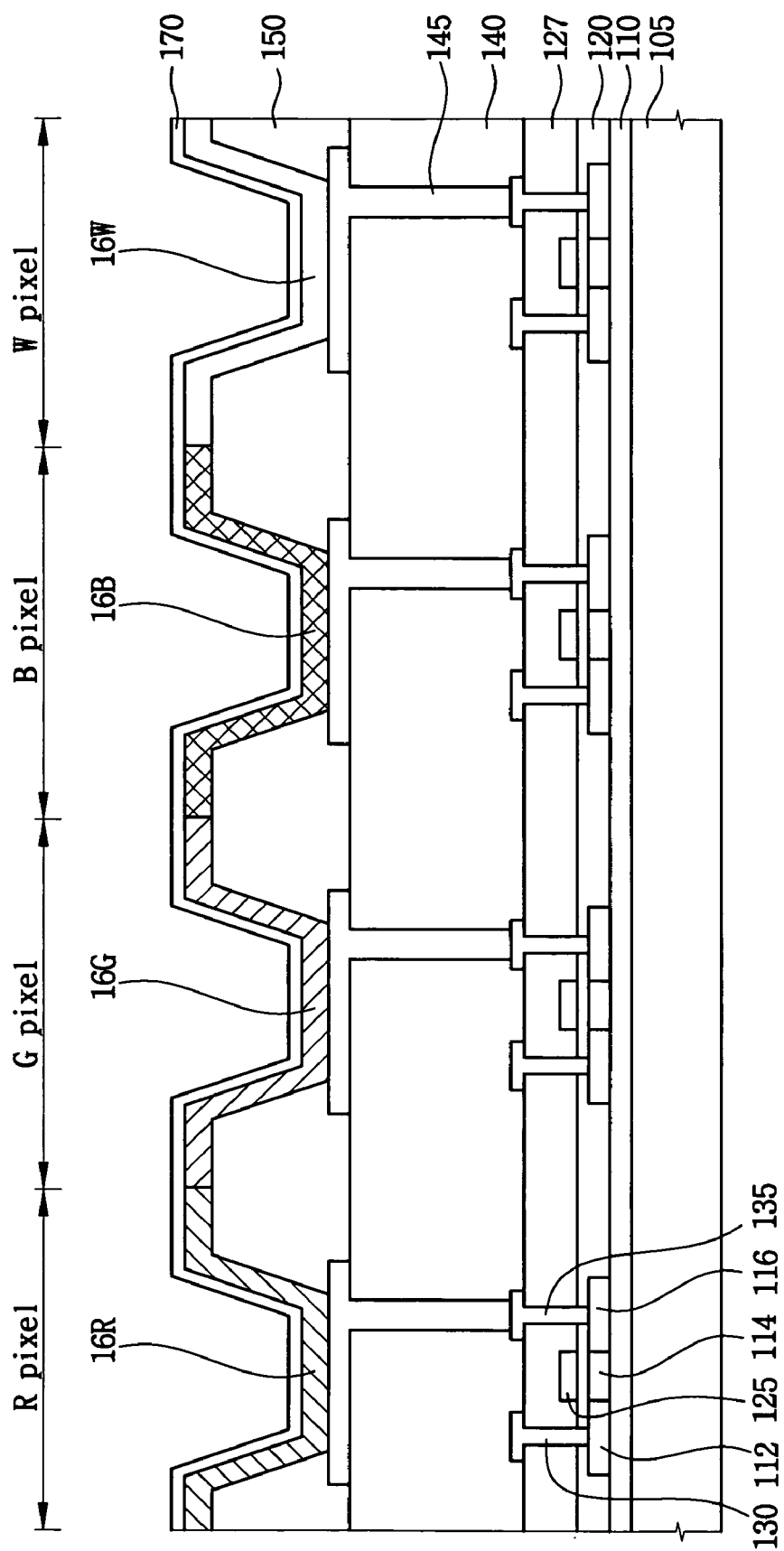
FIG. 9 is a cross-sectional view of the OELD device according to an exemplary embodiment of the present invention.

FIG. 9 is a cross-sectional view of an OELD panel according to an exemplary embodiment of the present invention. Referring to FIG. 9, an insulating layer 110 is formed on a substrate 105 which is a transparent substrate. The transparent substrate 105 is be made of material including glass, quartz, glass ceramic, crystal glass, or a combination thereof. The transparent substrate 105 is preferably made of refractory materials.

The insulating layer 110 may be omitted in case of employing the quartz substrate. The insulating layer 110 is made of material including, for example, silicon. The silicon insulating layer 110 may include oxygen, nitrogen or a mixture thereof. For example, the silicon insulating layer 110 may be a silicon oxide layer, a silicon nitride layer, or a silicon oxynitride layer (SiOxNy, here "x" and "y" are integers).

On the insulating layer 110, formed are current control transistors each of which includes an active layer, a gate insulating layer 120, a gate electrode 125, a first insulating interlayer 127, a source electrode 130, and a drain electrode 135. The active layer has a source region 112, a channel region 114, and a drain region 116. The gate insulating layer 120 is formed on the active layer to expose the source region 112 and the drain region 116. The gate electrode 125 is formed on the gate insulating layer 120. The first insulating interlayer 127 is formed on the gate electrode 125 and the gate insulating layer 120 to expose the source region 112 and the drain region 116. In particular, the first insulating interlayer 127 has contact holes formed at the substantially same positions of contact holes, respectively, of the gate insulating layer 120, so that the source region 112 and the drain region 116 are partially exposed through the corresponding contact holes of the gate insulating layer 120 and the first insulating interlayer 127. The source electrode 130 is formed on the first insulating interlayer 127 to be in contact with the source region 112 exposed through the corresponding contact holes of the gate insulating layer 120 and the first insulating interlayer 127. The drain electrode 135 is formed on the first insulating interlayer 127 to be in contact with the drain region 135 exposed through the corresponding contact holes of the gate insulating layer 120 and the first insulating interlayer 127.

Although the gate electrode 125 shown in FIG. 9 has a single layer structure, the gate electrode may have a structure of multiple layers in different embodiments. The source electrode 130 is connected to a source line extending in a first direction. The drain electrode 135 is connected to a drain line extending in a second direction different from the first direction. The gate electrode 125 of the current control transistor is connected to a drain region of a switching transistor (not shown) through the drain line. The source line is connected to a power supply line (not shown).

A second insulating interlayer 140 is formed on the first insulating interlayer 127 and the source and drain electrodes 130, 135 and has contact holes at the positions corresponding to the drain electrodes 135, so that the drain electrodes 135 are each exposed via corresponding one of the contact holes of the second insulating interlayer 140. The contact holes of the second insulating interlayer 140 are each aligned with corresponding one of the contact holes of the first insulating interlayer 127.

A pixel electrode 145 is formed in each of the contact holes of the second insulating interlayer 140 to be in contact with a corresponding drain electrode 135 through the corresponding contact hole of the second insulating interlayer 140. In particular, the pixel electrode 145 has a contact part extended from a part of the pixel electrode 145 formed on the second insulating interlayer 140 to the corresponding drain electrode 135 through the corresponding contact hole of the second insulating interlayer 140. The pixel electrode is made of, for example, conductive oxides.

Partition walls 150 are formed on the second insulating interlayer 140 and the pixel electrodes 145 to define luminescent regions of the OELD device. By the partition walls 150, a red light luminescent region, a green light luminescent region, a blue light luminescent region, and a white light luminescent region are defined in correspondence to the red, green, blue and white pixels, respectively. On the pixel electrodes 145 and the partition walls 150, organic EL layers are formed such that a red organic EL layer 16R, a green organic EL layer 16G, a blue organic EL layer 16B, and a white organic EL layer 16W are formed at the red, green, blue and white light luminescent regions, respectively, defined by the partition walls 150. As a result, the red, green, blue and white organic EL layers 16R, 16G, 16B, 16W illuminate red, green, blue and white light, respectively. Although the red, green, blue and white organic EL layers 16R, 16G, 16B, 16W in this embodiment have a single layer structure, the organic EL layers may have a structure of multiple layers in other embodiments. For example, the organic EL layers may have a multi-layer structure including a hole injecting layer, a hole transporting layer, a luminescent layer and an electron transporting layer that are laminated on the pixel electrode and the partition wall. Also, the organic EL layers may have a multi-layer structure including a hole transporting layer, a luminescent layer and an electron transporting layer, or a multi-layer structure including a hole injecting layer, a hole transporting layer, a luminescent layer, an electron transporting layer and an electron injecting layer.

A metal electrode 170 is formed on the organic EL layers 16R, 16B, 16B, 16W. The metal electrode 170 serves as a cathode of the organic EL layers and also protects the organic EL layers 16R, 16B, 16B, 16W. Although the metal electrode 170 formed on the organic EL layers serves as a cathode in the embodiment of FIG. 9, a layer made of material having a low work-function, such as magnesium (Mg), lithium (Li), calcium (Ca) or a mixture thereof, may be formed on the organic EL layers to serve as a cathode.

Since the OELD device of the present invention has the white pixel emitting the white light in addition to the red, green and blue pixels emitting red, green and blue light, respectively, the luminance of the OELD device is improved and optical efficiency is increased so that power consumption of the OELD device is reduced. The OELD device described above referring to FIG. 9 is a bottom luminescent type in which the metal electrode 170 is formed as a cathode on the organic EL layers so that red, green, blue and white light is reflected by the metal electrode 170 and emitted through the substrate 105. An OELD device of a top luminescent type is described below.

Figure 10:
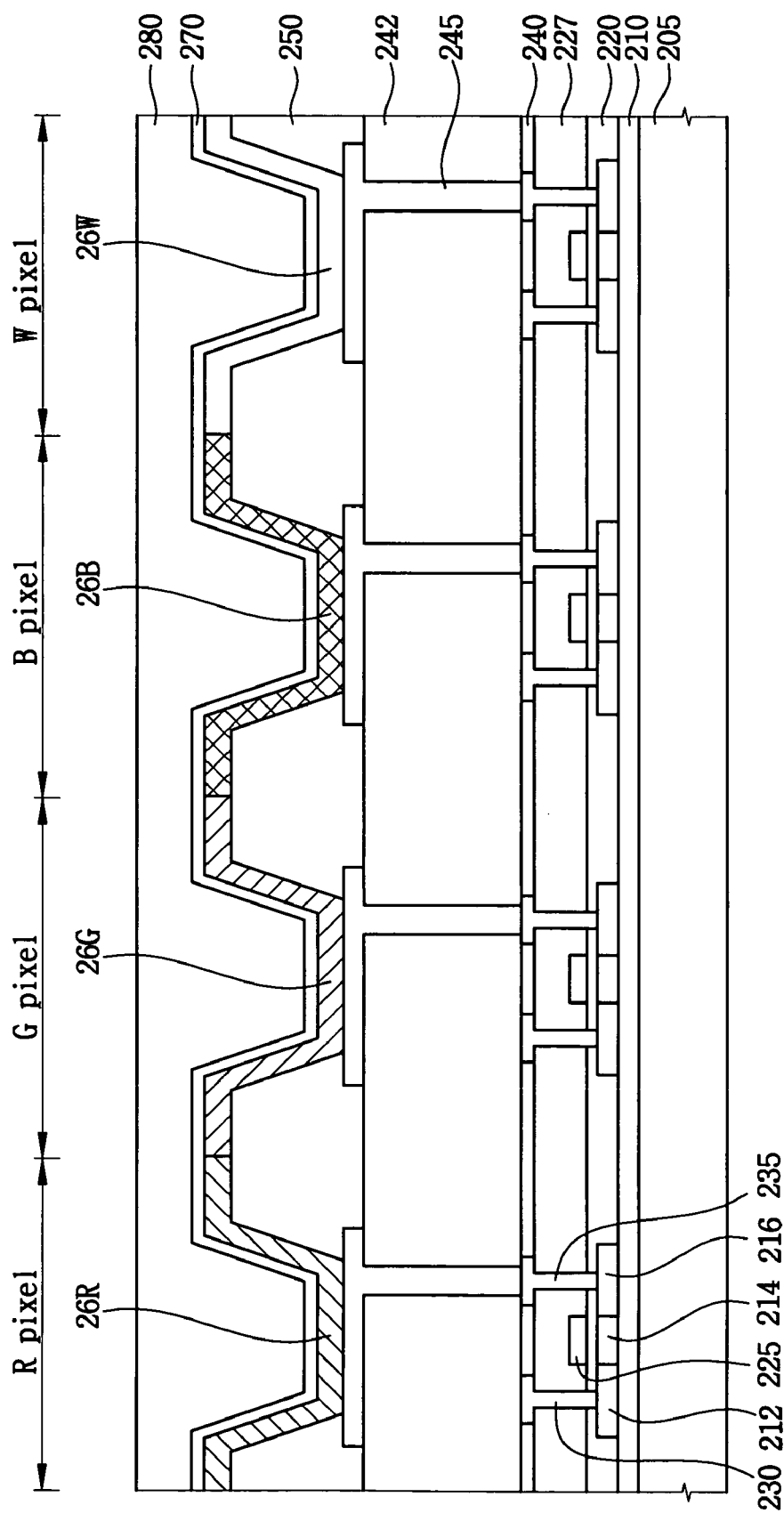
FIG. 10 is a cross-sectional view of the OELD device according to another exemplary embodiment of the present invention.

FIG. 10 is a cross-sectional view of an OELD panel according to another exemplary embodiment of the present invention. In the OELD panel of FIG. 10, an insulating layer 210 is formed on a substrate 205, and current control transistors are formed on the insulating layer 210. The current control transistors each include an active layer, a gate insulating layer 220, a gate electrode 225, a first insulating interlayer 227, a source electrode 230 and a drain electrode 235. The active layer has a source region 212, a channel region 214 and a drain region 216. The gate insulating layer 220 is formed on the active layer and has contact holes to expose the source region 212 and the drain region 216. The gate electrode 225 is formed on the gate insulating layer 220. The first insulating interlayer 227 is formed on the gate electrode 225 and the gate insulating layer 220 and has contact holes to expose the source region 212 and the drain region 216. The source electrode 230 and the drain electrode 235 are formed on the first insulating interlayer 227 to be in contact with the source and drain regions, respectively.

A second insulating interlayer 240 is formed on the first insulating interlayer 227 and has contact holes each receiving a part of the source or drain electrode. The source and drain electrodes 230, 235 are connected to source and drain lines, respectively. A planarizing layer 242 is formed on the second insulating layer 240 and the source and drain electrodes 230, 235. The planarizing layer 242 has contact holes each aligned with a corresponding drain electrode 135.

Pixel electrodes 245 made of, for example, conductive oxides, are formed on the planarizing layer 242 each to be in contact with the corresponding drain electrode 235 through a corresponding contact hole formed in the planarizing layer 242. Partition walls 250 are formed on the planarizing layer and the pixel electrodes 245 to define luminescent regions. Adjacent partition walls 250 define one luminescent region corresponding one of the red, green, blue and white pixels.

A red organic EL layer 26R, a green organic EL layer 26G, a blue organic EL layer 26B, and a white organic EL layer 26W are formed on the partition walls 250 and the pixel electrodes 245. The red, green, blue and white organic EL layers are defined at the regions of the red, green, blue and white pixels, respectively, and illuminate red, green, blue and white light, respectively. Although the organic EL layers have a single layer structure in this embodiment, the organic EL layers may be a structure of multiple layers in other embodiments.

A transparent electrode 270 is formed on the red, green, blue and white organic EL layers 26R, 26G, 26B, 26W to serve as a cathode. A transparent protecting layer 280 is formed on the transparent electrode 2780 to protect the transparent electrode 270.

The OELD device of the present invention improves luminance by employing 4-color pixels each having a white color sub-pixel in addition to red, green and blue color sub-pixels. Thus, optical efficiency is improved and power consumption is reduced in the OELD device of the present invention.

For manufacturing the OELD device of the active light-emitting type, some additional processes are necessitated such as depositing and patterning the RGBW materials using a shadow mask. A description follows of another embodiment of the OELD device of the present invention which may be manufactured by use of the photolithography method without necessitating a shadow mask process.

Figure 11:
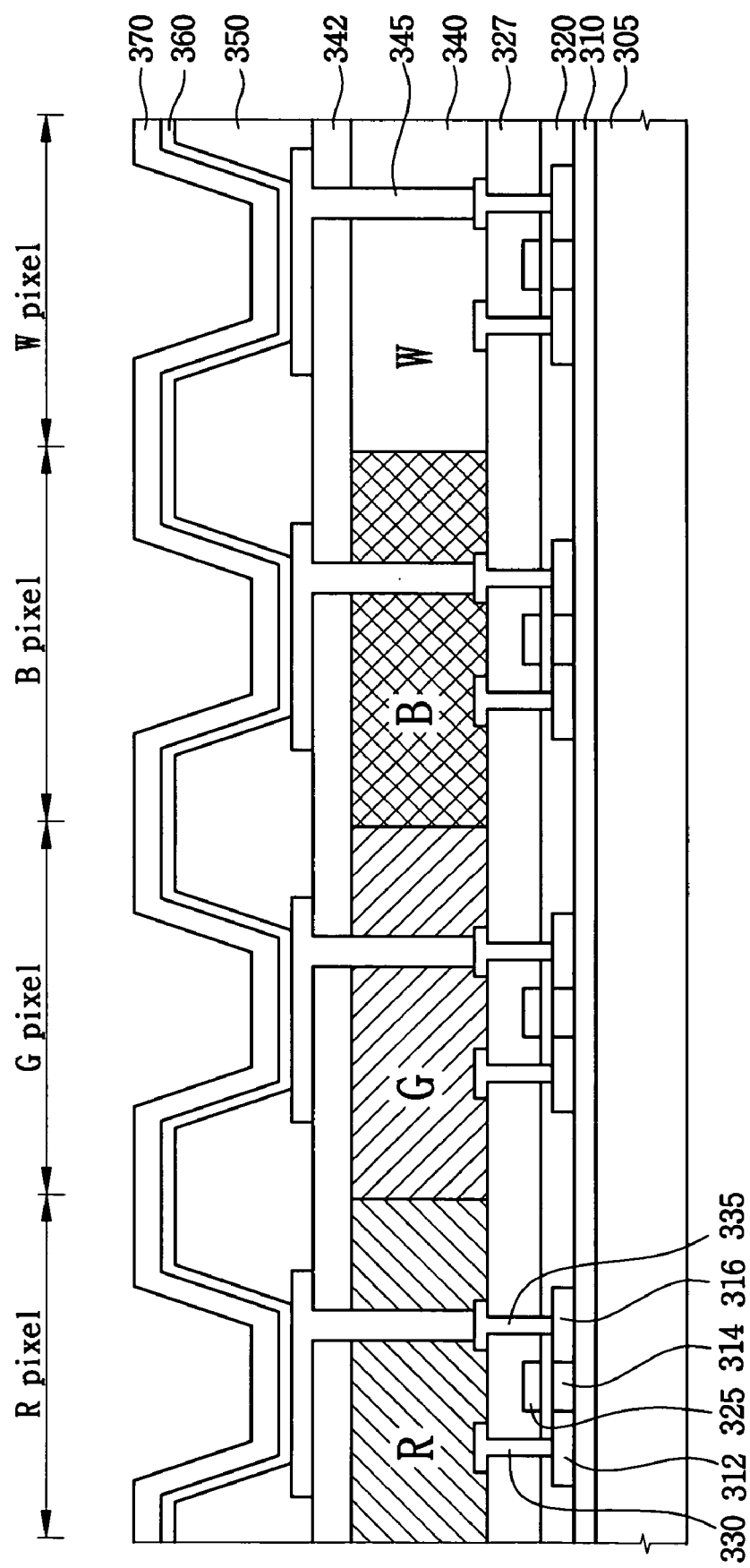
FIG. 11 is a cross-sectional view of the OELD device according to another exemplary embodiment of the present invention.

FIG. 11 is a cross-sectional view of an OELD panel of an OELD device according to another exemplary embodiment of the present invention. The OELD device of FIG. 11 is a bottom luminescent type and employs color filters. Referring to FIG. 11, an insulating layer 310 is formed on a substrate 305, and a current controlling transistor is formed on the insulating layer 310. The current controlling transistor includes an active layer, a gate insulating layer 320, a gate electrode 325, a first insulating interlayer 327, a source electrode 330 and a drain electrode 335. The active layer has a source region 312, a channel region 314 and a drain region 316. The gate insulating layer 320 is formed on the active layer and has contact holes to expose the source region 312 and the drain region 316, respectively.

The gate electrode 325 is formed on the gate insulating layer 320. The first insulating interlayer 327 is formed on the gate electrode 325 and the gate insulating layer 320 and has contact holes to expose the source region 312 and the drain region 316. The source and drain electrodes 330, 335 are formed on the first insulating interlayer 327 to be in contact with the source and drain regions 312, 316, respectively, through the corresponding contact holes of the first insulating interlayer 327 and the gate insulating layer 320. The source and drain electrodes 330, 335 are connected to source and drain lines, respectively.

A color pixel layer 340 is formed on the source and drain electrodes 330, 335 and the first insulating interlayer 327. The color pixel layer 340 includes red, green, blue and white color filters R, G, B, W. Each of the red, green, blue and white color filters R, G, B, W is formed on a corresponding one of the current control transistors. In other words, the red color filter is formed on the current control transistor for the red pixel, the green color filter on the current control transistor for the green pixel, the blue color filter on the current control transistor for the blue pixel, and the white color filter on the current control filter for the white pixel.

A planarizing layer 342 is formed on the color pixel layer 340 to planarize the red, green, blue and white color filters. The planarizing layer 342 is, for example, an organic resin layer such as a polyimide layer, a polyamide layer, an acryl layer or benzocyclobutene (BCB) layer. It is advantageous that the organic resin layer is readily planarized and has a low dielectric constant.

A pixel electrode 345 made of, for example, conductive oxides, is formed on the planarizing layer 342 to be in contact with the drain electrode 335 of the current control transistor through contact holes in the planarizing layer 342 and color pixel layer 340. A part of the pixel electrode 345 is extended though the contact holes of the planarizing layer 342 and the color pixel layer 340, which are aligned to the drain electrode 335 of the current control transistor.

Partition walls 350 are formed on the pixel electrodes 345 and the planarizing layer 342 to define red, green, blue and white luminescent regions. Adjacent partition walls 350 define corresponding one of the red, green, blue and white luminescent regions. An organic EL layer 360 is formed on the partition walls 350 and the pixel electrodes 345. The organic EL layer 360 is preferably a white EL layer.

A metal electrode 370 is formed on the organic EL layer 360 to protect the organic EL layer 360 from moisture or contaminants. The metal electrode 370 serves as a cathode of an EL element. Although the metal electrode 370 formed on the organic EL layer 360 serves as a cathode in this embodiment, a layer made of material having a low work-function, such as magnesium (Mg), lithium (Li), calcium (Ca) or a mixture thereof, may be formed on the organic EL layer 360 to serve as a cathode. In this case, a protecting electrode may be formed to protect the cathode and to connect a cathode of a pixel to another cathode of another pixel.

Also, although the OELD device of FIG. 11 has the white color filter W of transparent material to transmit the white light, the white color filter may be omitted in other embodiments of the OELD device. In this case, a thicker planarizing layer is formed instead of the white color filter in the white pixel region.

The OELD device of the present invention improves luminance by employing the white color filter W in addition to the red, green and blue color filters R, G, B between the current control transistors and the EL layer 360. As a result, optical efficiency of the OELD is improved and its power consumption is reduced.

Figure 12:
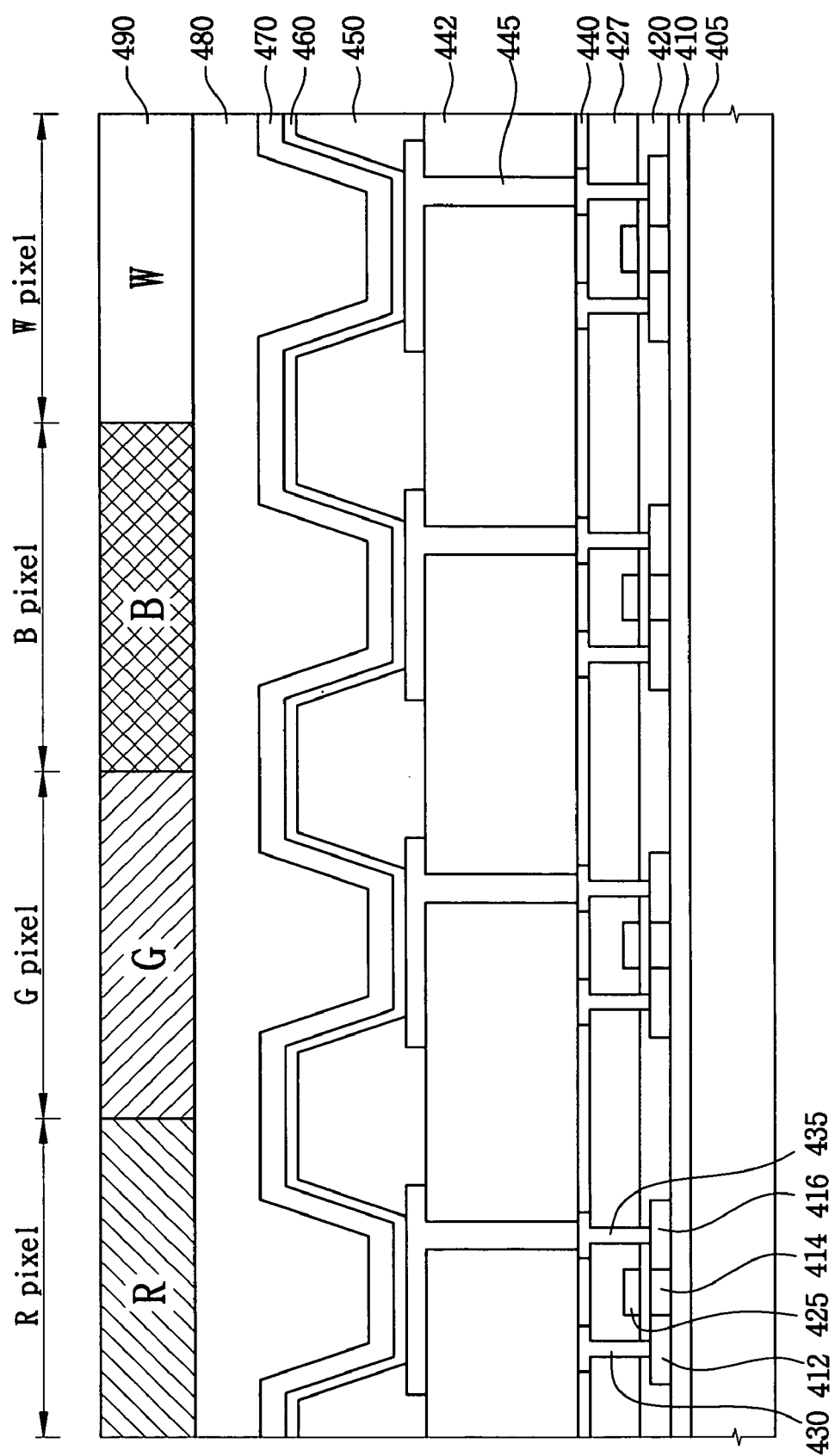
FIG. 12 is a cross-sectional view of the OELD device according to another exemplary embodiment of the present invention.

FIG. 12 is a cross-sectional view of an OELD panel of an OELD device according to another exemplary embodiment of the present invention. The OELD device is a top luminescent type and employs color filters. Referring to FIG. 12, an insulating layer 410 is formed on a substrate 405, and current controlling transistors are formed on the insulating layer 410. The current controlling transistors each include an active layer, a gate insulating layer 420, a gate electrode 425, a first insulating interlayer 427, a source electrode 430 and a drain electrode 435. The active layer has a source region 412, a channel region 414 and a drain region 416. The gate insulating layer 420 is formed on the active layer and contact holes to expose the source region 412 and the drain region 416. The gate electrode 425 is formed on the gate insulating layer 420. The first insulating interlayer 427 is formed on the gate electrode 425 and the gate insulating layer 420 and has contact holes to expose the source region 412 and the drain region 416. The source electrode 430 is formed on the first insulating interlayer 427 and in contact with the source region 412. The drain electrode 435 is formed on the first insulating interlayer 427 and in contact with the drain region 416. The source and drain electrodes 430, 435 are connected to source and drain lines, respectively.

A second insulating interlayer 440 is formed on the first insulating interlayer 427 and has contact holes to expose the source electrode 430 and the drain electrode 435. A planarizing layer 442 is formed on the second insulating interlayer 440 and the source and drain electrodes 430, 435. A pixel electrode 445 is formed on the planarizing layer 442 to be in contact with the drain electrode 435 of the current control transistor through a contact hole formed in the planarizing layer 442.

Partition walls 450 are formed on the pixel electrodes 445 and the planarizing layer 442 to define red, green, blue and white luminescent regions. An EL layer 460 is formed on the partition walls 450 and the pixel electrodes 445. Preferably, the EL layer 460 is a white organic EL layer. Also, the organic EL layer 460 may have a single layer structure or a structure of multiple layers.

A transparent electrode 470 is formed on the organic EL layers 460 to serve as a cathode, and a transparent protecting layer 480 is formed to protect the transparent electrode 470 from moisture or contaminants. A color pixel layer 490 is formed on the transparent protecting layer 480. The color pixel layer 490 includes red, green, blue and white color filters R, G, B, W. Each of the red, green, blue and white color filters is formed at a region of corresponding one of the red, green, blue and white pixels.

The OELD device of FIG. 12 is a top luminescent type and its luminance is improved by using the 4-color pixels each having a white color sub-pixel in addition to red, green and blue color sub-pixels. Also, the red, green, blue and white color filters are formed between the current control transistors and the EL layer 460. As a result, optical efficiency of the OELD device is improved and its power consumption is reduced.

In the OELD device of the top luminescent type, the transparent protecting layer 480 is formed on the transparent electrode 470 and the color filters 490 are formed on the transparent protecting layer 480, so that an aperture ratio (i.e., a ratio of an emitting area in a pixel to a whole pixel area) of the OELD device is increased. Therefore, the OELD device of the top luminescent type may have a higher resolution than an OELD device of a bottom luminescent type.

As described above, in the OELD device of the present invention, compensated 4-color RGBW gray-scale data is obtained from primary RGB gray-scale data using a data driving device with a fixed scaling factor. The compensated RGBW gray-scale data may be extended larger than the primary RGB data. The data driving device is capable of processing the compensated RGBW gray-scale data having a large bit-size. By displaying colors with the compensated RGBW gray-scale data, luminance and color sensitivity are improved. This is because the luminance is prevented from reducing even when the respective color data of the compensated RGBW gray-scale data has a higher color purity or is in the areas of extended gray-scale.

When one or more of the respective color data of the compensated RGBW gray-scale data has a higher color purity, the luminance may also be improved by setting the gray-scale as "1". In this case, a white color component is extracted from the primary RGB data and the extracted white color component is added to the compensated RGBW gray-scale data.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An organic electro-luminescent display (OELD) device for processing multi-color gray-scale data, comprising:
    a four-color converting part to generate gamma-converted RGB data by performing gamma conversion with respect to primary RGB gray-scale data by multiplying each component of the primary RGB gray-scale data by a value of an inverse of a corresponding maximum gray-scale level, to extract a white color component from the gamma-converted RGB data, to generate four-color RGBW data by subtracting the white color component from the gamma-converted RGB data and by adding white gray-scale data to the gamma-converted RGB data, and to perform reverse gamma conversion on the four-color RGBW data to generate compensated RGBW gray-scale data;
    a data driving part to process the compensated RGBW gray-scale data provided from the four-color converting part to generate four-color signals in an analog type;
    a scan driving part to generate scan signals in sequence; and
    an OELD panel to emit light with a color in response to the four-color signals from the data driving part and the scan signals from the scan driving part, wherein
    a white extracting part is configured to determine which color data of the gamma-converted RGB data has a minimum value and to compare the minimum value with a predetermined value relative to the maximum gray scale level and corresponding to a half luminance of the maximum gray scale level,
    the white extracting part generates the minimum value of the gamma-converted RGB data as the white color component if the minimum value is smaller than the predetermined value, and
    the white extracting part generates the predetermined value as the white color component if the minimum value is larger than the predetermined value.

2. The OELD device of claim 1, wherein the four-color converting part includes:
    a gamma converting part to perform the gamma conversion with respect to the primary RGB gray-scale data to obtain the gamma-converted RGB data;
    the white extracting part to extract the white color component from the gamma-converted RGB data provided from the gamma converting part;
    a data determining part to receive the gamma-converted RGB data from the gamma converting part and the white color component from the white extracting part and to generate the four-color RGBW data by subtracting the white color component from the gamma-converted RGB data and adding the white gray-scale data to the gamma-converted RGB data; and
    a reverse-gamma converting part to perform the reverse-gamma conversion with respect to the four-color RGBW data provided from the data determining part to generate reverse-gamma converted RGBW data to be displayed.

3. The OELD device of claim 1, wherein the OELD panel includes a plurality of pixels each including:
    a switching element having a conduction path to transfer corresponding one of the four-color signals from the data driving part in response to corresponding one of the scan signals from the scan driving part;
    a driving element having a conduction path to transfer a voltage signal provided from a power supply line in response to the corresponding one of the four-color signals provided from the switching element; and
    an organic electro-luminescent element to generate light in response to the voltage signal provided from the driving element.

4. The OELD device of claim 1, wherein the OELD panel includes a plurality of pixels each including a red sub-pixel, a green sub-pixel, a blue sub-pixel and a white sub-pixel, wherein the red, green, blue and white sub-pixels each have a stripe shape and are arranged in parallel to each other.

5. The OELD device of claim 1, wherein the OELD panel includes a plurality of pixels each including a red sub-pixel, a green sub-pixel, a blue sub-pixel and a white sub-pixel, wherein the red, green, blue and white sub-pixels are arranged in a 2×2 lattice shape.

6. The OELD device of claim 1, wherein the OELD panel includes a plurality of pixels each including two red sub-pixel, two green sub-pixel, a blue sub-pixel and a white sub-pixel, wherein the red, green, blue and white sub-pixels are arranged in a 2×3 lattice shape.

7. The OELD device of claim 1, wherein the OELD panel includes:
    a first insulating layer formed on a substrate;
    a current control transistor formed on the first insulating layer, the current control transistor providing a controlled current;
    a second insulating layer formed on the current control transistor, the second insulating layer having contact holes in which source and drain electrodes of the current control transistor are formed;
    a third insulating layer formed on the second insulating layer and the source and drain electrodes of the current control transistor;
    a pixel electrode formed on the third insulating layer, a part of the pixel electrode being extended to be in contact with the drain electrode of the current control transistor through a contact hole formed in the third insulating layer;
    partition walls formed on the third insulating layer and the pixel electrode, adjacent ones of the partition walls defining a luminescent region of the OELD panel;
    an organic electro-luminescent layer formed on partition walls and the pixel electrode, for emitting red, green, blue and white color light; and
    an electrode layer formed on the organic electro-luminescent layer to serve as a cathode of the OELD device.

8. The OELD device of claim 7, wherein the adjacent partition walls are formed to define corresponding one of red, green, blue and white pixel regions.

9. The OELD device of claim 8, wherein the organic electro-luminescent layer includes red, green, blue and white electro-luminescent layers formed on the red, green, blue and white pixel regions, respectively, defined by the partition walls.

10. The OELD device of claim 7, wherein the electrode layer is a metal layer so that light is reflected by the metal layer and emitted through the substrate.

11. The OELD device of claim 7, wherein the electrode layer is transparent so that light passes through the electrode layer.

12. The OELD device of claim 1, wherein the OELD panel includes:
- a first insulating layer formed on a substrate;
- a current control transistor formed on the first insulating layer, the current control transistor providing a controlled current;
- a second insulating layer formed on the current control transistor, the second insulating layer having contact holes in which source and drain electrodes of the current control transistor are formed;
- a color pixel layer formed on the second insulating layer and the source and drain electrodes, the color pixel layer including red, green, blue and white color filters;
- a planarizing layer formed on the color pixel layer;
- a pixel electrode formed on the planarizing layer, a part of the pixel electrode being extended to be in contact with the drain electrode of the current control transistor through contact holes formed in the planarizing layer and the color pixel layer;
- partition walls formed on the planarizing layer and the pixel electrode, adjacent ones of the partition walls defining a luminescent region of the OELD panel;
- an organic electro-luminescent layer formed on partition walls and the pixel electrode; and
- a metal electrode layer formed on the organic electro-luminescent layer to serve as a cathode of the OELD device.

13. The OELD device of claim 12, wherein the red, green, blue and white color filters of the color pixel layer are each formed between the current control transistor and the pixel electrode in a corresponding one of the red, green, blue and white pixel regions.

14. The OELD device of claim 1, wherein the OELD panel includes:
- a first insulating layer formed on a substrate;
- a current control transistor formed on the first insulating layer, the current control transistor providing a controlled current;
- a second insulating layer formed on the current control transistor, the second insulating layer having contact holes in which source and drain electrodes of the current control transistor are formed;
- a third insulating layer formed on the second insulating layer and the source and drain electrodes of the current control transistor;
- a pixel electrode formed on the third insulating layer, a part of the pixel electrode being extended to be in contact with the drain electrode of the current control transistor through a contact hole formed in the third insulating layer;
- partition walls formed on the third insulating layer and the pixel electrode, adjacent ones of the partition walls defining a luminescent region of the OELD panel;
- an organic electro-luminescent layer formed on partition walls and the pixel electrode;
- a transparent electrode layer formed on the organic electro-luminescent layer to serve as a cathode of the OELD device; and
- a color pixel layer formed on the transparent electrode layer, the color pixel layer including red, green, blue and white color filters.

* * * * *